United States Patent
Ji et al.

(10) Patent No.: US 7,672,350 B2
(45) Date of Patent: Mar. 2, 2010

(54) METHOD AND DEVICE FOR USING OPTICAL FEEDBACK TO OVERCOME BANDWIDTH LIMITATIONS CAUSED BY RELAXATION OSCILLATION IN VERTICAL CAVITY SURFACE EMITTING LASERS (VCSELS)

(75) Inventors: Chen Ji, San Jose, CA (US); Chung-Yi Su, Fremont, CA (US)

(73) Assignee: Avago Technologies Fiber IP (Singapore) Pte. Ltd., Singapore (SG)

( * ) Notice: Subject to any disclaimer, the term of this patent is extended or adjusted under 35 U.S.C. 154(b) by 52 days.

(21) Appl. No.: 12/164,923

(22) Filed: Jun. 30, 2008

(65) Prior Publication Data

US 2009/0323751 A1   Dec. 31, 2009

(51) Int. Cl.
*H01S 5/00* (2006.01)
(52) U.S. Cl. .............................. 372/50.11; 372/45.01
(58) Field of Classification Search .................. 257/82; 372/50.124, 45.01, 50.11
See application file for complete search history.

(56) References Cited

U.S. PATENT DOCUMENTS

| | | | |
|---|---|---|---|
| 6,990,135 B2 * | 1/2006 | Johnson et al. | 372/96 |
| 7,079,560 B2 * | 7/2006 | Jewell | 372/46.013 |
| 7,221,691 B2 * | 5/2007 | Johnson et al. | 372/45.01 |
| 2005/0271092 A1 | 12/2005 | Ledentsov et al. | |
| 2007/0291808 A1 * | 12/2007 | Ledentsov et al. | 372/50.11 |

FOREIGN PATENT DOCUMENTS

WO    WO 2006/105545 A1    10/2006

OTHER PUBLICATIONS

Xiaoxue Zhao et al., A New Aplifier Model for Resonance Enhancement of Optically Injection-Locked Lasers, IEEE Photonics Technology Letters, 2008.
Tomoaki Ota et al., Enhanced modulation bandwidth of surface-emitting laser with external optical feedback, IECE, Oct. 10, 2004, pp. 368-372, vol. 1, No. 13.
J.P. Reithmaier et al., Modulation Speed Enhancement By Coupling To Higher Order Resonances: A Road Towards 40 GHz Bandwidth Lasers On InP, IEEE, 2005, pp. 118-123.
Nikolai N. Ledentsov et al., High-Speed Quantum-Dot Vertical-Cavity Surface-Emitting Lasers, IEEE, Sep. 2007, pp. 1741-1756, vol. 95, No. 9.

(Continued)

*Primary Examiner*—Minsun Harvey
*Assistant Examiner*—Tuan N. Nguyen

(57) ABSTRACT

A semiconductor device is provided that includes an optical feedback structure that is monolithically integrated with a VCSEL device and which extends the speed of the VCSEL device beyond the speed to which it would otherwise be limited due to relaxation oscillation. The optical feedback structure does not rely on light emissions from the VCSEL substrate material to produce optical feedback. Consequently, extension of the bandwidth of the semiconductor device through the use of optical feedback is not limited by the absorption threshold wavelength of the substrate material. Furthermore, because the optical feedback structure does not include the substrate, the ability to use optical feedback to extend the bandwidth of the device is independent of the precision with which the substrate thickness can be controlled.

22 Claims, 4 Drawing Sheets

OTHER PUBLICATIONS

Geert Morthier et al., Extended Modulation Bandwidth of DBR and External Cavigy Lasers by Utilizing a Cavity Resonance for Equalization, IEEE Journal, Dec. 2000, pp. 1468-1475.

Daniel M. Grasso et al., Direct Modulation Characteristics of Composite Resonator Vertical-Cavity Lasers, IEEE Journal, Dec. 2006, pp. 1248-1254, vol. 42, No. 12.

Kerry Vahala et al., Observation of modulation speed enhancement, frequency modulation suppression, AIP, Jun. 1, 1985, pp. 1025-1027, vol. 46, No. 11.

O. Kjebon et al., 30 GHz direct modulation bandwith in detuned loaded InGaAsP DBR lasers at 1.55um wavelength, Electronic Letters, Mar. 13, 1997, pp. 488-489, vol. 33, No. 6.

* cited by examiner

METHOD AND DEVICE FOR USING OPTICAL FEEDBACK TO OVERCOME BANDWIDTH LIMITATIONS CAUSED BY RELAXATION OSCILLATION IN VERTICAL CAVITY SURFACE EMITTING LASERS (VCSELS)

TECHNICAL FIELD OF THE INVENTION

The invention relates to vertical cavity surface emitting laser diode (VCSEL) devices. More particularly, the invention relates to an optical feedback structure that is integrated with a VCSEL device and that overcomes bandwidth limitations in VCSEL devices caused by relaxation oscillation.

BACKGROUND OF THE INVENTION

VCSEL devices are laser diode devices used in a variety of applications to generate optical signals. For example, in optical communications networks, VCSEL devices are often used to generate optical information signals that are transmitted over optical fibers of the network. The speed at which a VCSEL device can be driven, or modulated, ultimately is limited by the onset of relaxation oscillation inherent to the operation of the VCSEL device. In such devices, relaxation oscillation is a manifestation of the energy exchanged between the total photon and carrier populations when the laser is disturbed from a steady state condition. This energy exchange results in a damped optical output power oscillation at the relaxation oscillation frequency. The relaxation oscillation frequency is a function of the square root of the laser bias current. In general, the relaxation oscillation frequency, $f_R$, for a given bias current, is relatable to the maximum modulation frequency bandwidth at which a laser diode can be driven, defined by the figure of merit $f_{3dB}$, by the expression:

$$f_{3dB} \sim 1.55 * f_R.$$

Thus, the 3-decibel (dB) modulation bandwidth of the laser diode is limited to a value of about 1.55 times the relaxation oscillation frequency.

Although the intrinsic speed, or bandwidth, of materials currently used in VCSEL devices can be as high as 40 gibabits per second (Gbps), many technological factors have thus far made it difficult to overcome the limitations imposed by relaxation oscillation and extend VCSEL speed beyond about 10 Gbps. One technique that has been employed in laser diodes to overcome limitations imposed by relaxation oscillation involves using optical feedback to extend bandwidth.

For example, one proposed optical feedback structure for a VCSEL device employs a curved mirror to produce optical feedback that results in enhancement of the bandwidth of the VCSEL device. The proposed implementation, however, has several drawbacks. First, the VCSEL device substrate makes up part of the optical feedback structure and has an effect on the optical feedback that is used to extend the bandwidth. Consequently, the operating wavelength of the VCSEL device is limited to wavelengths that are longer than the absorption band edge wavelength of the substrate material. For example, if a gallium arsenide (GaAs) substrate material is used, the device will need to operate at a wavelength that is longer than 870 nanometers (nm) (bandgap energy 1.424 eV for GaAs). This wavelength is longer than the 850 nm wavelength most commonly used in optical communications networks. Therefore, the proposed VCSEL device would not be suitable for use in most optical communications networks.

Second, the curved mirror must be formed to provide adequate optical feedback to a laser cavity located at a distance from the mirror that is more than ten times the size of the laser aperture. Fabricating such a mirror with the necessary precision would be very difficult, if not impossible, and would introduce additional complexity into the VCSEL device fabrication process.

Third, the proposed implementation for the VCSEL device requires controlling the thickness of the die used in the process with a precision of less than one wavelength in order to provide the necessary phase control of the optical feedback. For example, for a 900 nm wavelength, the die thickness would need to be controlled to a precision of less than 30 nm. Such precision is very difficult, if not impossible, to achieve with current state-of-the-art lapping and polishing methods used to thin semiconductor substrates.

The use of optical feedback to extend bandwidth has also been employed in edge emitting lasers. Such devices generally rely on mode coupling between the main laser mode and a side resonant mode, resulting in the formation of an additional resonance peak at a higher frequency in the radio frequency (RF) spectrum. Coupling between the modes, sometimes referred to as "push-pull", operates to generate additional resonance conditions in the higher frequency regime, thereby enhancing its overall modulation bandwidth.

The coupled cavity designs employed in edge emitting laser diodes have several disadvantages. The designs are typically realized by creating a coupled feedback cavity comprising either a long passive distributed Bragg reflector (DBR) structure or an external mirror configuration. The external cavities tend to be expensive, extremely sensitive to system setup stability and generally suitable only for laboratory use. The DBR comprises a grating structure that is manufactured using either electron beam (e-beam) lithography or holographic writing techniques, which are expensive to perform and have relatively low throughput. In addition, edge emitting lasers can only be tested after facet cleaving, which results in higher testing costs and lower yield.

Other edge emitting laser diode devices that use optical feedback to extend bandwidth do not rely on mode coupling, but instead rely on shifting of the Fabrey-Perot (FP) resonant mode wavelength of the device relative to the reflectivity maximum wavelength of the device. This shifting of the FP mode resonant wavelength (i.e., the lasing wavelength) is often referred to as "detuning". In these devices, the amplitude and phase of the optical feedback are controlled to cause the lasing wavelength to be detuned by a positive amount relative to the maximum reflectivity wavelength. This positive detuning results in the maximum modulation bandwidth of the device being extended.

One of the disadvantages of edge emitting laser diode devices that use detuning to enhance bandwidth is that the DBR is implemented as a relatively long grating structure that is relatively expensive to produce. Growing the grating structure requires the use of multiple epitaxial growth steps, which increases process complexity and costs. In addition, as stated above, edge emitting lasers can only be tested after facet cleaving, which results in higher testing costs and lower yield.

VCSEL devices are generally capable of being manufactured with higher yield and lower manufacturing costs than edge emitting lasers, due in part to the fact that they can be tested directly at the wafer level. Coupled active cavity resonance designs have also been proposed in VCSEL devices for extending bandwidth. Such designs, however, do not rely on principles of optical feedback, but rather, on interactions between the photon population and independent electron populations residing in multiple active multi-quantum well (MQW) cavities in the device to increase the relaxation oscillation frequency, $f_R$, which indirectly results in an increase in $f_{3dB}$ in accordance with the above equation. One of the disadvantages of this type of design is that use of the multiple active cavities increases the complexity of the biasing circuitry, which increases manufacturing costs. Another disadvantage is that bandwidth enhancement is predictable only for a narrow set of parameters and is difficult to achieve experimentally.

SUMMARY OF THE INVENTION

The invention provides a semiconductor device and method. The semiconductor device comprises a VCSEL device and an optical feedback structure. The VCSEL device comprises at least a first distributed Bragg reflector (DBR), a second DBR, a multi-quantum well (MQW) and current confinement region, and a substrate. The MQW and current confinement region is between the first and second DBRs and provides an active cavity in the semiconductor device in which electrons are converted into photons to produce light. At least some of the light produced in the active cavity is emitted as laser light from the semiconductor device having a maximum modulation bandwidth. The optical feedback structure comprises at least a third DBR and an optical spacer. The optical spacer is between the first DBR and the third DBR and provides a passive cavity in the semiconductor device. At least some of the light that is produced in the active cavity passes through the first DBR into the optical spacer of the optical feedback structure. The optical feedback structure provides optical feedback to the VCSEL device that results in an increase in the maximum modulation bandwidth of the laser light emitted from the semiconductor device.

The method comprises forming a VCSEL device and an optical feedback structure in a semiconductor device. The VCSEL device comprises at least a first DBR, a second DBR, a MQW and current confinement region, and a substrate. The MQW and current confinement region is between the first and second DBRs and provides an active cavity in the semiconductor device in which electrons are converted into photons to produce light. At least some of the light produced in the active cavity is emitted as laser light from the semiconductor device having a maximum modulation bandwidth. The optical feedback structure comprises at least a third DBR and an optical spacer. The optical spacer is between the first DBR and the third DBR and provides a passive cavity in the semiconductor device. At least some of the light that is produced in the active cavity passes through the first DBR into the optical spacer of the optical feedback structure. The optical feedback structure provides optical feedback to the VCSEL device that results in an increase in the maximum modulation bandwidth of the laser light emitted from the semiconductor device.

These and other features and advantages of the invention will become apparent from the following description, drawings and claims.

DETAILED DESCRIPTION OF AN EMBODIMENT

A need exists for a device that uses optical feedback to extend the maximum modulation bandwidth of a laser diode to include useful operating wavelengths (e.g., 850 nm) beyond those to which the laser diode is inherently limited by relaxation oscillation. A need also exists for such a device that can be relatively easily fabricated using typical semiconductor fabrication processes. A need also exists for such a device that does not rely on substrate emissions for optical feedback so that extending the bandwidth of the laser diode is not limited by the absorption threshold wavelength of the substrate material. A further need exists for such a device that does not rely on substrate thickness so that extending the maximum modulation bandwidth of the laser diode is not dependent upon whether or not the substrate thickness can be controlled with sufficient precision.

In accordance with the invention, a semiconductor device is provided that includes an optical feedback structure that is monolithically integrated with a VCSEL device and which extends the speed of the VCSEL device beyond the speed to which it would otherwise be limited by the occurrence of relaxation oscillation. The semiconductor device of the invention is relatively easy to fabricate using known semiconductor fabrication processes. In addition, the optical feedback structure does not rely on light emissions from the VCSEL substrate material to produce optical feedback. Consequently, extension of the bandwidth of the semiconductor device through the use of optical feedback is not limited by the absorption threshold wavelength of the substrate material. Furthermore, because the optical feedback structure does not include the substrate, the ability to use optical feedback to extend the bandwidth of the semiconductor device is not dependent on the precision with which the substrate thickness can be controlled. This allows the semiconductor device to be designed and manufactured for operation at the 850 nm wavelength most often used in optical communications networks, although the invention is not limited to any particular wavelength or wavelength range.

Figure 1:
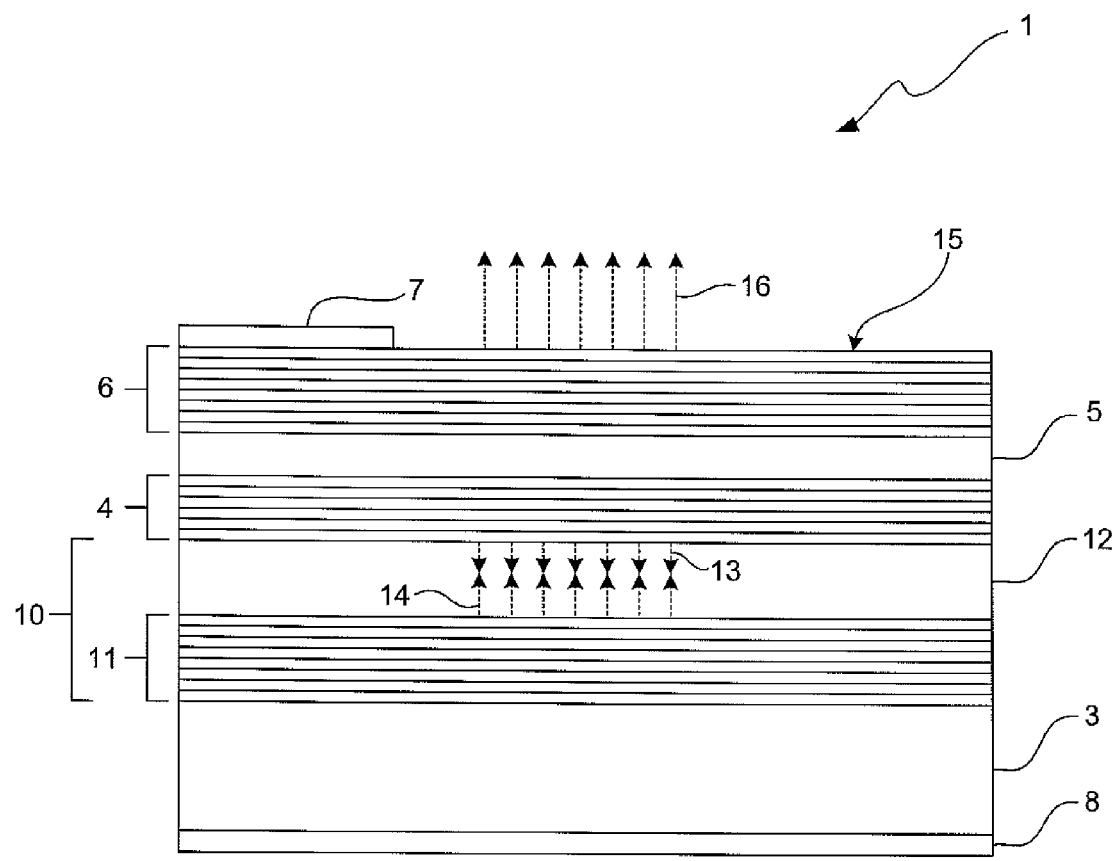
FIG. 1 illustrates a cross-sectional plan view of the semiconductor device of the invention in accordance with an illustrative embodiment.

FIG. 1 illustrates a cross-sectional plan view of the semiconductor device 1 of the invention in accordance with an illustrative embodiment. The semiconductor device 1 includes a VCSEL device having a substrate 3, a lower DBR 4, an active MQW and current confinement region 5, an upper DBR 6, a top electrical contact 7, and a bottom electrical contact 8. The VCSEL device operates in the typical manner with the active region 5 receiving an electrical current and converting electrical carriers into photons, which are then emitted into the lower and upper DFBs 4 and 6. The DBRs 4 and 6 partially reflect and partially pass the light that impinges on them.

The semiconductor device 1 also includes an optical feedback structure 10 in accordance with an illustrative embodiment, which includes a DBR 11 and a passive optical spacer 12. In accordance with this embodiment, the optical feedback structure 10 is sandwiched between the lower DBR 4 of the VCSEL device and the substrate 3 of the VCSEL device. Unlike the aforementioned known proposed VCSEL device, the semiconductor device 1 shown in FIG. 1 does not rely on light emission from the substrate 3 to provide optical feedback. In other words, the substrate 3 is not part of the optical feedback structure 10. Rather, the substrate 3 is below the optical feedback structure 10 and has very little, if any, effect, on the optical feedback. Consequently, unlike the aforementioned known proposed VCSEL device, extension of the bandwidth of the semiconductor device 1 through the use of optical feedback is not limited by, or dependent upon, the absorption threshold wavelength of the material used for the substrate 3. Also, because the substrate 3 is not part of the optical feedback structure 10, extension of the bandwidth of the semiconductor device 1 also is not dependent upon the sufficiency with which the thickness of the substrate 3 can be controlled. These features of the invention facilitate extension of the bandwidth to include useful frequencies while also enabling the semiconductor device 1 to be fabricated with relative ease using typical semiconductor fabrication processes.

The semiconductor device 1 operates as follows. As indicated above, the VCSEL device is made up of substrate 3, lower DBR 4, active MQW and current confinement region 5, upper DBR 6, top electrical contact 7, and bottom electrical contact 8. The VCSEL device 1 operates in the normal manner, i.e., in the manner in which typical VCSEL devices operate. When the VCSEL device is modulated, carriers are converted into photons in the active MQW/current confinement region 5, resulting in light being emitted from the active MQW/current confinement region 5. The VCSEL device, like typical VCSEL devices, has a relaxation oscillation that is triggered when the VCSEL device is modulated at a speed that is higher than the speed at which carriers are converted into photons in the active MQW/current confinement region 5.

Some of the light emitted by the active MQW/current confinement region 5 passes into the upper DBR 6. Some of the light that passes into the upper DBR 6 is reflected back into the active MQW/current confinement region 5. Some of the light emitted by the active MQW/current confinement region 5 passes into the lower DBR 4. Some of the light that passes into the lower DBR 4 is reflected back into the active MQW/current confinement region 5. This back and forth reflection between the upper and lower DBRs 4 and 6 into the active MQW/current confinement region 5 provides the pumping action needed for lasing, i.e., to cause monotonic light to be emitted from the surface 15 of the VCSEL device. The arrows 16 represent the monotonic light emitted from the surface 15 of the VCSEL device.

Some of the light emitted by the active MQW/current confinement region 5 propagates through the DBR 4 and into the passive optical spacer 12, as indicated by arrows 13. This light propagates through the optical spacer 12 and encounters the DBR 1. The DBR 11 is configured to reflect substantially all of the light it encounters. The light reflected by the DBR 11 is represented by arrows 14. The light reflected by the DBR 11 passes through the optical spacer 12 where it constructively and destructively interferes with the light represented by arrows 13. Some of this light then passes through DBR 4 and into the active MQW/current confinement region 5. The light that passes through the DBR 4 and into the active MQW/current confinement region 5 is the optical feedback that allows the bandwidth of the VCSEL device to be extended beyond that to which it would otherwise be limited due to relaxation oscillation. Because of the operation of the feedback structure 10, the light 16 emitted from the surface 15 of the VCSEL device includes light at a frequency that is significantly higher than $1.55*f_R$. Thus, the optical feedback structure 10 extends the bandwidth of the semiconductor device 1.

The semiconductor device 1 may be configured to extend the bandwidth of the VCSEL device through either of two different mechanisms. The first of these mechanisms, referred to herein as mechanism (1), operates by generating two distinct resonant modes with a frequency separation between them that results in a resonant peak being produced at a frequency in the RF band that is higher than the operating intrinsic relaxation oscillation frequency. The second of these mechanisms, referred to herein as mechanism (2), operates by positive detuning the VCSEL device such that the roundtrip reflectivity peak (i.e., the reflectivity maximum wavelength) of the VCSEL device and the FP resonant mode wavelength of the VCSEL device are shifted relative to one another. Thus, the semiconductor device 1 is configured to implement whichever of mechanisms (1) and (2) is chosen for use in enhancing the bandwidth of the VSEL device.

Mechanism (1) is achieved by adjusting the reflectivity of the lower DBR 4 of the VCSEL device and by selecting the thickness of the optical spacer 12 to create cavity coupling between the active and passive cavities 5 and 12, respectively, to cause two coupled VCSEL modes to be produced. These two VCSEL modes are separated by a frequency difference that is significantly above the relaxation oscillation frequency of the VCSEL device. The operating bandwidth of the VCSEL device is extended through the "push-pull" of these two modes. Thus, in addition to extending the bandwidth of the VCSEL device, the semiconductor device 1 can also be configured to realize multiple wavelength modes.

Mechanism (2) is achieved by adjusting the thickness of the passive cavity 12 to modify the amplitude and phase of the optical feedback by selected amounts. More specifically, in this case, the thickness of the optical spacer 12 is selected to provide an appropriate phase shift and an amount of wavelength detuning for the optical mode needed for differential gain enhancement. If the semiconductor device 1 is configured to implement mechanism (2), the bandwidth of the VCSEL device is enhanced beyond that to which it would otherwise be limited by relaxation oscillation, but only a single mode is produced.

The optical spacer 12 preferably comprises a semiconductor material that is transparent to light at the operating wavelength of the VCSEL device. The optical spacer 12 preferably is epitaxially grown. Because epitaxial growth processes enable the thickness of a layer to be very precisely controlled, using an epitaxial growth process to form the optical spacer 12 ensures that it will have the desired thickness, which is important when implementing either of mechanisms (1) and (2). Preferably, the DBR 11 of the optical feedback structure is also epitaxially grown. The DBR 11 comprises alternating layers of material having varying refractive indices. Growing these layers ensures that the thicknesses and refractive indices of the layers are precisely controlled such that the DBR 11 acts as a full reflector providing substantially 100% reflectance. Alternatively, the DBR 11 can be formed by patterned etching or lifting of deposited partially reflecting dielectric layers.

The components 4, 5 and 6 that make up the VCSEL device may be formed using processes that are typically used to form VSEL devices. For example, the VCSEL device may be an "Oxide VCSEL" device, in which the layers that make up the MQW/current confinement region 5 are achieved through selective oxidation of one or more other layers that have been epitaxially grown. In this case, both the lower and upper DBRs 4 and 6, respectively, are formed by epitaxial growth. Alternatively, one or both of the DBRs 4 and 6 may be formed through deposition of dielectric thin films having varying indexes of refraction.

Another alternative to constructing the semiconductor device 1 as an Oxide VCSEL device is to construct the VCSEL device as an "Implant VCSEL" device. In this case, the current confinement layer of the MQW/current confinement region 5 is achieved by selectively removing electrical conductivity from the layer through ion implantation. The optical index guiding layers of region 5 may be achieved through use of a thermal lensing process. Alternatively, the optical index guiding layers of region 5 may be achieved through etching or deposition processes. The lower and upper DBRs 4 and 6, respectively, may both be formed by epitaxial growth. Alternatively, one or both of the DBRs 4 and 6 may be formed through deposition of dielectric thin films having varying indexes of refraction.

Another alternative is to construct the VCSEL device as a "Diffused VCSEL" device. In this case, the current confinement layers of the MQW/current confinement region 5 are achieved through selective diffusion of n or p dopants into the layers. The optical index guiding layers of region 5 may be achieved through thermal lensing, through etching or through deposition processes. The lower and upper DBRs 4 and 6, respectively, may both be formed by epitaxial growth, or, alternatively, through deposition of dielectric thin films having varying indexes of refraction.

The semiconductor device 1 may be made of a variety of materials. For example, if an operating wavelength of 850 nm is desired, the substrate 3 may be GaAs. In this case, the DBRs 4, 6 and 11, the active region 5 and the passive optical spacer 12 are typically different variations of the aluminum gallium arsenide (AlGaAs) composition. The variations in the compositions of AlGaAs are achieved by varying the amounts of Al and/or Ga in the compositions to produce layers having predetermined refractive index values that differ from layer to layer. In cases in which a 1300 nm operating wavelength is desired (another popular wavelength for optical communications networks), other compositions, such as indium phosphide (InP), for example, may be used to construct the semiconductor device 1. In cases in which a visible operating wavelength is desired, other compositions, such as gallium nitride (GaN) for blue-green wavelengths, for example, may be used to construct the semiconductor device 1.

It should be noted that the invention is not limited with respect to the materials or processes that are used to construct the semiconductor device 1. The materials and processes described above are merely examples of a few suitable materials and processes.

Figure 2:
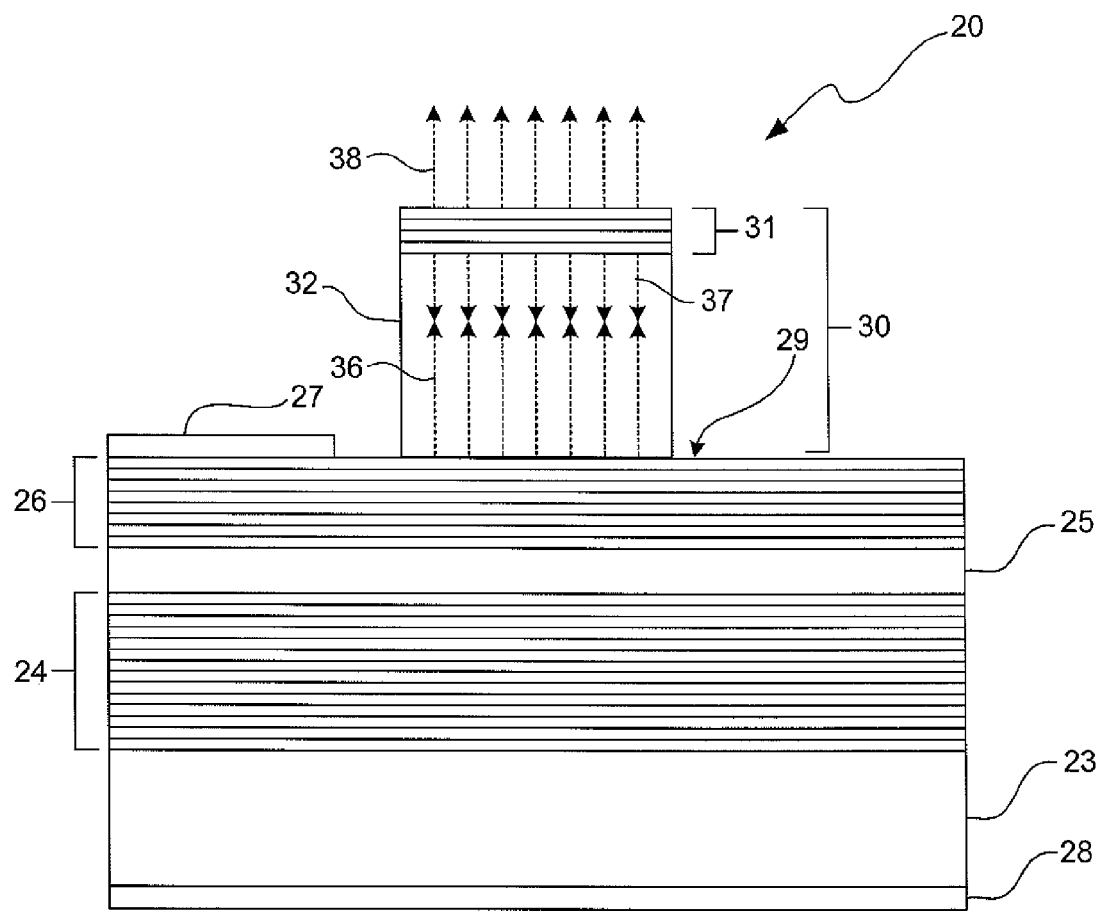
FIG. 2 illustrates a cross-sectional plan view of the semiconductor device of the invention in accordance with another illustrative embodiment.

FIG. 2 illustrates a cross-sectional plan view of the semiconductor device 20 of the invention in accordance with another illustrative embodiment. The semiconductor device 20 includes a VCSEL device made up of a substrate 23, a lower DBR 24, an active MQW and current confinement region 25, an upper DBR 26, a top electrical contact 27, and a bottom electrical contact 28. The VCSEL device operates in the typical manner as follows. An electrical current injected into the active region 25 is converted into photons to produce light, which is then emitted into the lower and upper DBRs 24 and 26, respectively. The DBRs 24 and 26 partially reflect the light that impinges on them and partially pass the light that impinges on them. Reflection of the light back and forth between the DBRs 24 and 26 and into the active MQW/current confinement region 25 creates the pumping action needed for lasing.

Like the semiconductor device 1 shown in FIG. 1, the semiconductor device 20 includes an optical feedback structure 30 having a DBR 31 and a passive optical spacer 32. In accordance with this embodiment, however, the optical feedback structure 30 is formed on the light emitting surface 29 of the VCSEL device rather than between the substrate and the VCSEL device, as is the case with the embodiment described above with reference to FIG. 1. The optical spacer 32 is transparent to light at the operating wavelength. The semiconductor device 20 operates in a manner similar to the manner in which the semiconductor device 1 operates. As electrical current is injected into the active MQW/current confinement region 25, carriers are converted into photons to produce light, which is emitted into the lower and upper DBRs 24 and 26, respectively. The lower DBR 24 is configured to be totally reflective so that it reflects substantially all of the light that impinges thereon. Therefore, virtually none of the light that encounters the DBR 24 passes into the substrate 23.

The upper DBR 26 of the VCSEL device is configured to be partially reflective so that it reflects some of the light that passes into it from the active region 25 and allows some of the light to pass into the passive optical spacer 32, as indicated by arrows 36. The light that passes through the DBR 26 and the optical spacer 32 impinges on the DBR 31. Some of the light that impinges on the DBR 31 propagates through it and is emitted out of the semiconductor device, as indicated by arrows 38. Some of the light that impinges on the DBR 31 is reflected by the DBR 31 back into the optical spacer 32, as indicated by arrows 37. The light represented by arrows 36 and 37 constructively and destructively interferes in the optical spacer 32 to produce optical feedback. This optical feedback enhances the bandwidth of the semiconductor device 20 such the light 38 emitted from the surface 29 of the VCSEL device has a frequency that is significantly higher than $1.55*f_R$. Thus, the optical feedback structure 30 extends the bandwidth of the semiconductor device 20.

The semiconductor device 20 may be manufactured using the materials and processes described above with reference to FIG. 1. Like the semiconductor device 1 shown in FIG. 1 and described above, the semiconductor device 20 is configured to implement either of the aforementioned mechanisms (1) and (2) in order to extend the bandwidth of the semiconductor device 20. The manner in which these two mechanisms operate will now be described in more detail with reference to FIGS. 3 and 4.

Figure 3:
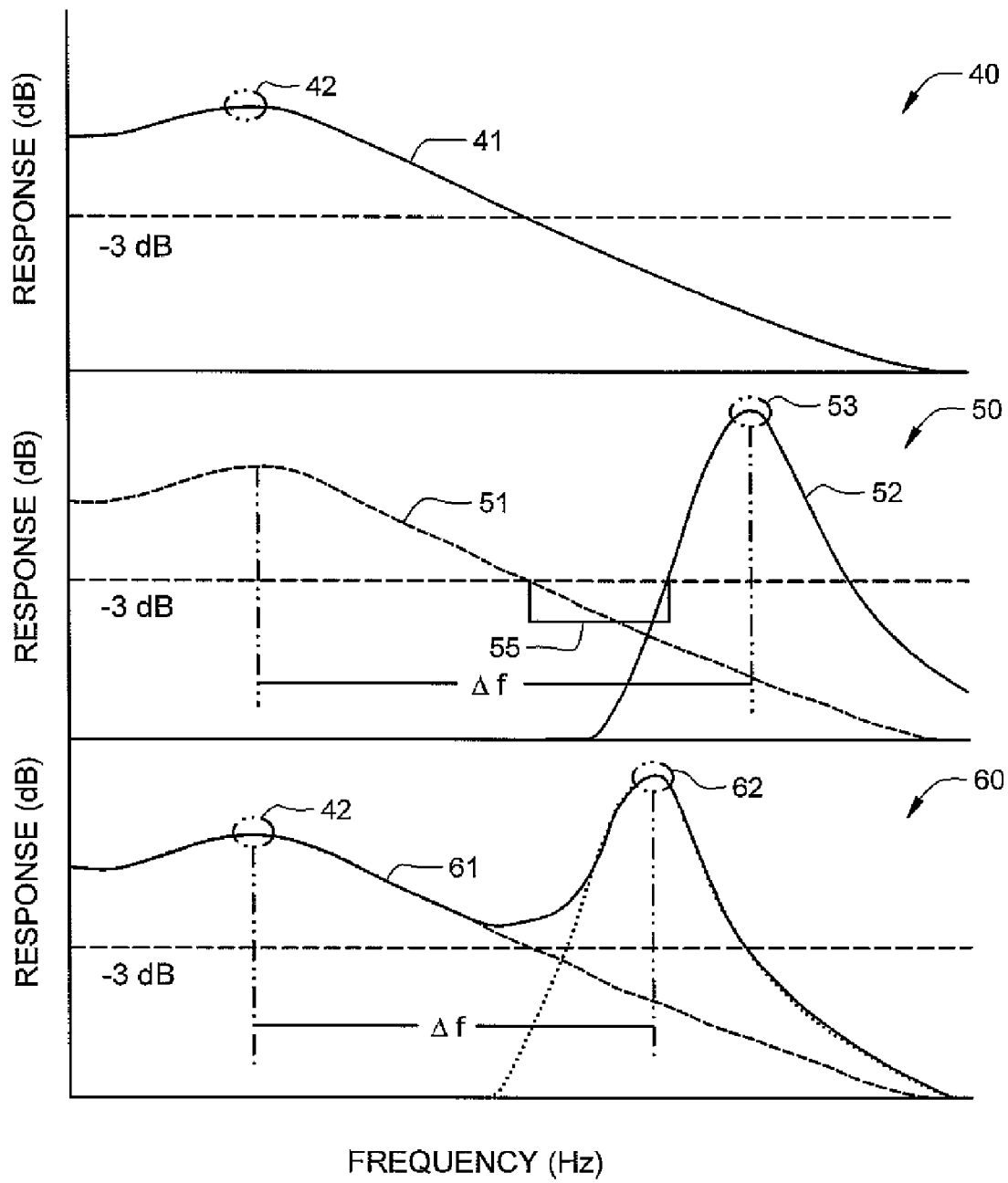
FIG. 3 illustrates three separate graphs that demonstrate the manner in which the devices shown in FIGS. 1 and 2 can operate to extend the bandwidth of the VCSEL device through cavity coupling.

FIG. 3 illustrates three separate graphs 40, 50 and 60 containing Bode magnitude plots that demonstrate the manner in which mechanism (1) operates to extend the bandwidth of the VCSEL device. The upper graph 40 contains a Bode plot 41 that represents the frequency response of the VCSEL device when electron-to-photon resonance occurs due to relaxation oscillation. In the plot 41, the relaxation oscillation resonance peak occurs at the frequency and gain values corresponding to point 42 on plot 41. The middle graph 50 contains a dashed curve 51 corresponding to the Bode plot 41 shown in the upper graph 40 and contains a second Bode plot 52 that represents the frequency response of the VCSEL device when photon-to-photon resonance occurs. The photon-to-photon resonance occurs due to optical coupling between the passive cavity (optical spacer 12 in FIG. 1 or optical spacer 32 in FIG. 2) and the active cavity (active region 5 in FIG. 1 or active region 25 in FIG. 2). The photon-to-photon resonance peak corresponds to the point 53 on Bode plot 51.

The resonance peaks 42 and 53 shown in graphs 40 and 50, respectively, correspond to respective modes produced by the VCSEL device. The distance between the resonance peaks 42 and 53 corresponds to a frequency separation of $\Delta f$. It can be seen in graph 50 that a gap 55 in the bandwidth of the VCSEL device occurs where the frequency responses associated with electron-to-photon resonance and with photon-to-photon resonance are attenuated by 3 dB. However, this gap disappears when the semiconductor devices 1 and 20 are designed to have a suitable frequency separation, $\Delta f$, as can be seen in the lower graph 60.

The lower graph 60 contains a third Bode plot 61 having a first resonance peak 42 corresponding to the electron-to-photon resonance that occurs during relaxation oscillation and a second resonance peak 62 corresponding to the photon-to-photon resonance that occurs during optical coupling between the passive cavity and the active cavity. Graph 60 represents the coupling that occurs between the two resonant modes when the semiconductor devices 1 and 20 are constructed to achieve a suitable frequency separation Δf between the resonance peaks 42 and 62. When the semiconductor devices 1 and 20 are constructed to achieve a suitable frequency separation Δf, the resonances overlap resulting in an extension of the bandwidth of the VCSEL device with the 3 dB gap 55 shown in graph 50 eliminated.

It has been determined that a frequency separation Δf of between about 10 and 20 gigahertz (GHz) is sufficient to provide the type of resonance coupling needed to enhance the bandwidth of the VCSEL device in the manner demonstrated in graph 60. The desired frequency separation is achieved by constructing the DBRs 4 and 24 shown in FIGS. 1 and 2, respectively, of a particular number of DBR pairs. Each DBR pair is made up of a first layer having a first refractive index and an adjacent layer having a second refractive index that is different from the first refractive index. For example, the amounts of Al and Ga in two adjacent AlGa layers of the DBR may be varied to provide the two layers with different refractive indexes. It has been determined that constructing the DBR 4 shown in FIG. 1 of fifty or more DBR pairs is sufficient to provide the VCSEL device of the semiconductor device 1 with a frequency separation of about 20 GHz.

It should be noted that other techniques may be used to generate coupling between the passive and active cavity than adjusting the number of DBR pairs that make up the DBRs 4 and 24 shown in FIGS. 1 and 2, respectively. For example, DBRs constructed of gratings may be used. Also, the construction and/or composition of the DBRs may be such that they provide refractive index variations that are not perfectly periodic, which are sometimes referred to as "chirped" DBRs or gratings. Thus, the invention is not limited with respect to the manner in which the optical coupling between the passive and active cavities is achieved.

Figure 4:
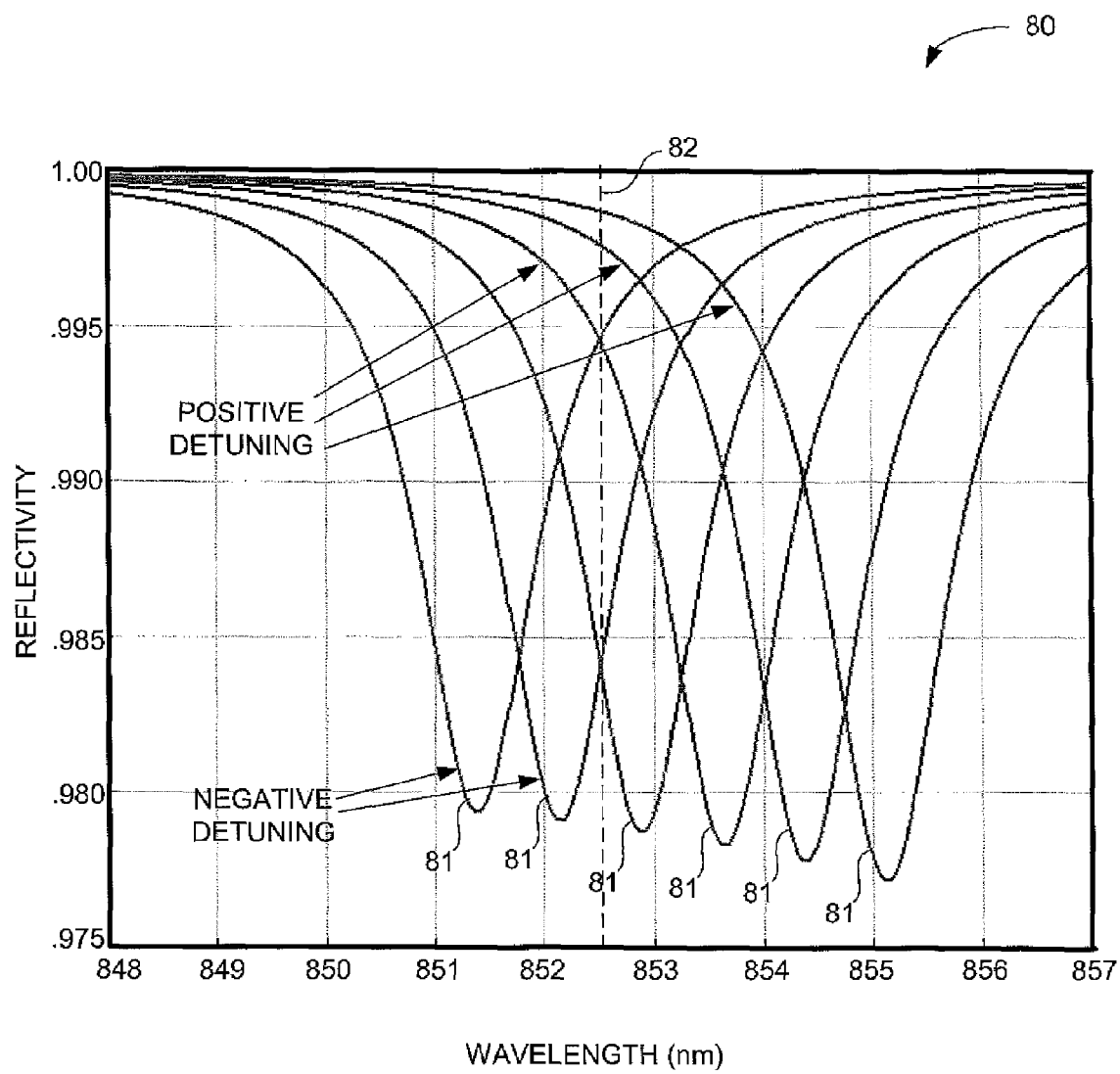
FIG. 4 illustrates a graph that demonstrates the manner in which the devices shown in FIGS. 1 and 2 can operate to extend the bandwidth of the VCSEL device through phase detuning.

FIG. 4 illustrates a graph 80 that demonstrates an example of the manner in which the principles associated with mechanism (2) may be applied. Graph 80 contains several curves 81 corresponding to plots of cavity roundtrip reflectivity as a function of the lasing wavelength of the VCSEL device. As indicated above, mechanism (2) operates by positively detuning the reflectivity peak of the VCSEL device such that it is shifted relative to the FP resonant mode of the VCSEL device. In the graph 80, the vertical dashed line 82 corresponds to the FP resonant mode wavelength (i.e., the lasing wavelength), which, in this example, remains approximately constant for different amounts of detuning and occurs at a wavelength of between about 852 and about 853 nm.

It can be seen from the graph 80 that with positive detuning, the lasing mode is located in a region where the cavity reflectivity decreases with increasing wavelength, whereas negative detuning occurs with the lasing mode positioned where the reflectivity increases with wavelength. In accordance with this embodiment, positive detuning is used to extend the maximum modulation bandwidth of the semiconductor device. Detuning can be achieved by adjusting the thickness of the passive optical cavity (cavity 12 in FIG. 1 and cavity 32 in FIG. 2) by a fraction of the FP resonant wavelength. In the example demonstrated by the graph 80, detuning is achieved by adjusting the thickness of the optical spacer 12 or 32 by an amount that varies from about 0.74λ to 0.77λ, where λ represents the lasing wavelength or FP resonance wavelength. Thus, the bandwidth of the VCSEL device can be extended by controlling the thickness of the passive cavity 12 or 32. As indicated above, preferably the passive cavity 12 or 32 is epitaxially grown, which enables its thickness to be very precisely controlled to achieve the desired amount of positive detuning. Alternatively, positive detuning can be achieved by adjusting the composition and/or the number of DBR pairs of the DBRs 11 and 31, thereby modifying the coupled passive cavity reflectivity.

It should be noted that in both of the illustrative embodiments described above with reference to FIGS. 1 and 2, the semiconductor devices 1 and 20 each include a passive cavity and an active cavity. Thus, in both cases, bandwidth enhancement of the VCSEL device can be achieved through either of mechanism (1) and mechanism (2). In addition, in both of the illustrative embodiments, the optical feedback structures 10 and 30 of the devices 1 and 20 do not include the substrates 3 and 23, respectively. Thus, the capabilities of the feedback structures 10 and 30 to extend the bandwidths of the devices 1 and 20 are not affected by the composition or thickness of the substrates 3 and 23, respectively. These features of the invention provide the aforementioned advantages of enabling the bandwidth to be extended to include useful frequencies while also enabling the semiconductor devices to be fabricated with relative ease at relatively low cost and with relatively high yield using typical semiconductor fabrication processes.

It should be noted that the invention has been described with reference to a few illustrative embodiments for the purposes of demonstrating the principles and concepts of the invention. The invention, however, is not limited to these embodiments, as will be understood by persons of skill in the art in view of the disclosure provided herein. Many modifications can be made to the embodiments described herein, and all such modifications are within the scope of the invention.

What is claimed is:

1. A semiconductor device comprising:
a vertical cavity surface emitting laser (VCSEL) device comprising at least a first distributed Bragg reflector (DBR), a second DBR, a multi-quantum well (MQW) and current confinement region, and a substrate, the MQW and current confinement region being between the first and second DBRs and providing an active cavity in the semiconductor device in which electrons are converted into photons to produce light, at least some of the light produced in the active cavity being emitted as laser light from the semiconductor device, the laser light emitted from the semiconductor device having a maximum modulation bandwidth; and
an optical feedback structure comprising at least a third DBR and an optical spacer, the optical spacer being between the first DBR and the third DBR, the optical spacer providing a passive cavity in the semiconductor device, and wherein at least some of the light that is produced in the active cavity passes through the first DBR into the optical spacer of the optical feedback structure, the optical feedback structure providing optical feedback to the VCSEL device that results in an increase in the maximum modulation bandwidth of the light emitted from the semiconductor device, wherein the optical feedback structure is between the substrate and the VCSEL device such that the first DBR is adjacent the optical spacer and the third DBR is adjacent the substrate, and wherein at least a portion of the light that passes through the first DBR into the optical spacer is encountered by the third DBR, the third DBR reflecting substantially all of the light encountered thereby, and wherein the laser light emitted from the semiconductor device is light that passes through the second DBR moving in a direction away from the active channel.

2. The semiconductor device of claim 1, wherein the optical feedback provided by the optical feedback structure to the VCSEL device creates optical cavity coupling between the active and passive cavities that operates to increase the maximum modulation bandwidth of the light emitted from the semiconductor device.

3. The semiconductor device of claim 2, wherein the optical cavity coupling between the active and passive cavities causes the laser light emitted from the semiconductor device to have at least two light modes.

4. The semiconductor device of claim 3, wherein the two light modes correspond to two respective resonant frequencies, the two respective resonant frequencies being separated by a frequency difference amount that is controlled at least in part by constructing the first DBR of a particular number of DBR pairs, the particular number of DBR pairs being pre-selected to achieve the frequency different amount.

5. The semiconductor device of claim 4, wherein the one or more of the first, second and third DBRs are formed by an epitaxial growth process.

6. The semiconductor device of claim 4, wherein one or more of the first, second and third DBRs are formed by a deposition process.

7. The semiconductor device of claim 1, wherein the optical feedback provided by the optical feedback structure to the VCSEL device has a phase and amplitude that are controlled to cause a Fabrey-Perot (FP) resonant mode wavelength of the VCSEL device to be positively detuned relative to a reflectivity maximum wavelength of the VCSEL device by a selected amount, the detuning of the FP resonant mode wavelength operating to increase the maximum modulation bandwidth of the light emitted from the semiconductor device.

8. The semiconductor device of claim 7, wherein the detuning amount is controlled at least in part by providing the optical spacer with a particular thickness, the particular thickness of the optical spacer being pre-selected to achieve the detuning amount.

9. The semiconductor device of claim 8, wherein the optical spacer is formed by an epitaxial growth process.

10. A method for increasing an maximum modulation bandwidth of laser light emitted from a semiconductor device, the method comprising:
forming a vertical cavity surface emitting laser (VCSEL) device in a semiconductor device, the VCSEL device comprising at least a first distributed Bragg reflector (DBR), a second DBR, a multi-quantum well (MQW) and current confinement region, and a substrate, the MQW and current confinement region being between the first and second DBRs and providing an active cavity in the semiconductor device in which electrons are converted into photons to produce light, at least some of the light produced in the active cavity being emitted as laser light from the semiconductor device, the laser light emitted from the semiconductor device having an maximum modulation bandwidth; and
forming an optical feedback structure in the semiconductor device, the optical feedback structure comprising at least a third DBR and an optical spacer, the optical spacer being between the first DBR and the third DBR, the optical spacer providing a passive cavity in the semiconductor device, and wherein at least some of the light that is produced in the active cavity passes through the first DBR into the optical spacer of the optical feedback structure, the optical feedback structure providing optical feedback to the VCSEL device that results in an increase in the maximum modulation bandwidth of the light emitted from the semiconductor device, wherein the step of forming the optical feedback structure is performed before the step of forming the VCSEL device is performed such that the optical feedback structure is between the substrate and the VCSEL device, the first DBR being adjacent the optical spacer and the third DBR being adjacent the substrate, and wherein at least a portion of the light that passes through the first DBR into the optical spacer is encountered by the third DBR, the third DBR reflecting substantially all of the light encountered thereby, and wherein the laser light emitted from the semiconductor device is light that passes through the second DBR moving in a direction away from the active channel.

11. The method of claim 10, wherein the optical feedback provided by the optical feedback structure to the VCSEL device creates optical cavity coupling between the active and passive cavities that operates to increase the maximum modulation bandwidth of the light emitted from the semiconductor device.

12. The method of claim 11, wherein the optical cavity coupling between the active and passive cavities causes the laser light emitted from the semiconductor device to have at least two light modes.

13. The method of claim 12, wherein the two light modes correspond to two respective resonant frequencies, the two respective resonant frequencies being separated by a frequency difference amount that is controlled at least in part by constructing the first DBR of a particular number of DBR pairs, the particular number of DBR pairs being pre-selected to achieve the frequency different amount.

14. The method of claim 13, wherein the one or more of the first, second and third DBRs are formed by an epitaxial growth process.

15. The method of claim 13, wherein one or more of the first, second and third DBRs are formed by a deposition process.

16. The method of claim 10, wherein the optical feedback provided by the optical feedback structure to the VCSEL device has a phase and amplitude that are controlled to cause a Fabrey-Perot (FP) resonant mode wavelength of the VCSEL device to be positively detuned by a selected amount relative to a reflectivity maximum wavelength of the VCSEL device, the detuning of the FP resonant mode wavelength operating to increase the maximum modulation bandwidth of the light emitted from the semiconductor device.

17. The method of claim 16, wherein the detuning amount is controlled at least in part by providing the optical spacer with a particular thickness, the particular thickness of the optical spacer being pre-selected to achieve the detuning amount.

18. The method of claim 17, wherein the optical spacer is formed by an epitaxial growth process.

19. A semiconductor device comprising:
a vertical cavity surface emitting laser (VCSEL) device comprising at least a first distributed Bragg reflector (DBR), a second DBR, a multi-quantum well (MQW) and current confinement region, and a substrate, the MQW and current confinement region being between the first and second DBRs and providing an active cavity in the semiconductor device in which electrons are converted into photons to produce light, at least some of the light produced in the active cavity being emitted as laser light from the semiconductor device, the laser light emitted from the semiconductor device having a maximum modulation bandwidth; and
an optical feedback structure comprising at least a third DBR and an optical spacer, the optical spacer being between the first DBR and the third DBR, the optical spacer providing a passive cavity in the semiconductor device, and wherein at least some of the light that is produced in the active cavity passes through the first DBR into the optical spacer of the optical feedback structure, the optical feedback structure providing optical feedback to the VCSEL device that results in an increase in the maximum modulation bandwidth of the light emitted from the semiconductor device, wherein the VCSEL device is between the optical feedback structure and the substrate such that the second DBR is adjacent the substrate and the first DBR is adjacent the optical spacer, and wherein at least a portion of the light that passes through the first DBR into the optical spacer is encountered by the third DBR, the third DBR passing at least a portion of the light encountered thereby and reflecting at least a portion of the light encountered thereby, and wherein the laser light emitted from the semiconductor device is light that passes through the third DBR moving in a direction away from the passive channel.

20. A semiconductor device comprising:

a vertical cavity surface emitting laser (VCSEL) device comprising at least a first distributed Bragg reflector (DBR), a second DBR, a multi-quantum well (MQW) and current confinement region, and a substrate, the MQW and current confinement region being between the first and second DBRs and providing an active cavity in the semiconductor device in which electrons are converted into photons to produce light, at least some of the light produced in the active cavity being emitted as laser light from the semiconductor device, the laser light emitted from the semiconductor device having a maximum modulation bandwidth; and an optical feedback structure comprising at least a third DBR and an optical spacer, the optical spacer being between the first DBR and the third DBR, the optical spacer providing a passive cavity in the semiconductor device, and wherein at least some of the light that is produced in the active cavity passes through the first DBR into the optical spacer of the optical feedback structure, the optical feedback structure providing optical feedback to the VCSEL device that results in an increase in the maximum modulation bandwidth of the light emitted from the semiconductor device, wherein the optical feedback provided by the optical feedback structure to the VCSEL device creates optical cavity coupling between the active and passive cavities that operates to increase the maximum modulation bandwidth of the light emitted from the semiconductor device, and wherein the optical cavity coupling between the active and passive cavities causes the laser light emitted from the semiconductor device to have at least two light modes.

21. A method for increasing an maximum modulation bandwidth of laser light emitted from a semiconductor device, the method comprising:

forming a vertical cavity surface emitting laser (VCSEL) device in a semiconductor device, the VCSEL device comprising at least a first distributed Bragg reflector (DBR), a second DBR, a multi-quantum well (MQW) and current confinement region, and a substrate, the MQW and current confinement region being between the first and second DBRs and providing an active cavity in the semiconductor device in which electrons are converted into photons to produce light, at least some of the light produced in the active cavity being emitted as laser light from the semiconductor device, the laser light emitted from the semiconductor device having an maximum modulation bandwidth; and forming an optical feedback structure in the semiconductor device, the optical feedback structure comprising at least a third DBR and an optical spacer, the optical spacer being between the first DBR and the third DBR, the optical spacer providing a passive cavity in the semiconductor device, and wherein at least some of the light that is produced in the active cavity passes through the first DBR into the optical spacer of the optical feedback structure, the optical feedback structure providing optical feedback to the VCSEL device that results in an increase in the maximum modulation bandwidth of the light emitted from the semiconductor device, wherein the step of forming the optical feedback structure is performed after the step of forming the VCSEL device is performed such that the VCSEL device is between the optical feedback structure and the substrate, the second DBR being adjacent the substrate and the first DBR being adjacent the optical spacer, and wherein at least a portion of the light that passes through the first DBR into the optical spacer is encountered by the third DBR, the third DBR passing at least a portion of the light encountered thereby and reflecting at least a portion of the light encountered thereby, and wherein the laser light emitted from the semiconductor device is light that passes through the third DBR moving in a direction away from the passive channel.

22. A method for increasing an maximum modulation bandwidth of laser light emitted from a semiconductor device, the method comprising:

forming a vertical cavity surface emitting laser (VCSEL) device in a semiconductor device, the VCSEL device comprising at least a first distributed Bragg reflector (DBR), a second DBR, a multi-quantum well (MQW) and current confinement region, and a substrate, the MQW and current confinement region being between the first and second DBRs and providing an active cavity in the semiconductor device in which electrons are converted into photons to produce light, at least some of the light produced in the active cavity being emitted as laser light from the semiconductor device, the laser light emitted from the semiconductor device having an maximum modulation bandwidth; and forming an optical feedback structure in the semiconductor device, the optical feedback structure comprising at least a third DBR and an optical spacer, the optical spacer being between the first DBR and the third DBR, the optical spacer providing a passive cavity in the semiconductor device, and wherein at least some of the light that is produced in the active cavity passes through the first DBR into the optical spacer of the optical feedback structure, the optical feedback structure providing optical feedback to the VCSEL device that results in an increase in the maximum modulation bandwidth of the light emitted from the semiconductor device, wherein the optical feedback provided by the optical feedback structure to the VCSEL device creates optical cavity coupling between the active and passive cavities that operates to increase the maximum modulation bandwidth of the light emitted from the semiconductor device, and wherein the optical cavity coupling between the active and passive cavities causes the laser light emitted from the semiconductor device to have at least two light modes.

* * * * *